United States Patent
Yoon et al.

(10) Patent No.: US 11,158,833 B2
(45) Date of Patent: Oct. 26, 2021

(54) ORGANIC ELECTROLUMINESCENT DEVICE AND MANUFACTURING METHOD THEREFOR

(71) Applicant: LG Chem, Ltd., Seoul (KR)

(72) Inventors: Seokhee Yoon, Daejeon (KR); Jinseck Kim, Daejeon (KR); Sungkyoung Kang, Daejeon (KR); Donggu Lee, Daejeon (KR); Hwakyung Kim, Daejeon (KR); Jae Hak Jeong, Daejeon (KR); Jiyeon Shin, Daejeon (KR); Daeho Kim, Daejeon (KR); Jaesoon Bae, Daejeon (KR); Jaechol Lee, Daejeon (KR)

(73) Assignee: LG Chem, Ltd.

( * ) Notice: Subject to any disclaimer, the term of this patent is extended or adjusted under 35 U.S.C. 154(b) by 386 days.

(21) Appl. No.: 16/310,971

(22) PCT Filed: Jul. 4, 2017

(86) PCT No.: PCT/KR2017/007087
§ 371 (c)(1),
(2) Date: Dec. 18, 2018

(87) PCT Pub. No.: WO2018/012782
PCT Pub. Date: Jan. 18, 2018

(65) Prior Publication Data
US 2020/0127222 A1    Apr. 23, 2020

(30) Foreign Application Priority Data
Jul. 14, 2016  (KR) .................. 10-2016-0089386

(51) Int. Cl.
*H01L 51/00* (2006.01)
*H01L 51/50* (2006.01)
*H01L 51/56* (2006.01)

(52) U.S. Cl.
CPC ...... *H01L 51/5092* (2013.01); *H01L 51/0007* (2013.01); *H01L 51/0084* (2013.01); *H01L 51/5056* (2013.01); *H01L 51/56* (2013.01)

(58) Field of Classification Search
None
See application file for complete search history.

(56) References Cited

U.S. PATENT DOCUMENTS 3,161,584 A * 12/1964 Gleim ............... C10G 45/16
208/264
3,867,417 A *  2/1975 Gleim ............... C07C 329/00
556/44

(Continued)

FOREIGN PATENT DOCUMENTS

CN    1499901 A     5/2004
CN  101488561 A     7/2009

(Continued)

OTHER PUBLICATIONS

Machine translation of JP-2008189564, translation generated Feb. 2021, 11 pages. (Year: 2021).*

(Continued)

*Primary Examiner* — Robert S Loewe
(74) *Attorney, Agent, or Firm* — Lerner, David, Littenberg, Krumholz & Mentlik, LLP

(57) ABSTRACT

The present specification relates to a hole injection or transfer layer or charge generation layer coating composition of an organic electroluminescence device including an organic metal complex including sulfur; and an organic solvent, a method for manufacturing an organic electroluminescence device using the same, and an organic electroluminescence device.

19 Claims, 1 Drawing Sheet

| 701 |
|---|
| 601 |
| 501 |
| 401 |
| 301 |
| 201 |
| 101 |

(56) References Cited

U.S. PATENT DOCUMENTS

| | | | | |
|---|---|---|---|---|
| 5,126,465 | A | * | 6/1992 | Greaney .............. C07F 11/005 556/61 |
| 5,906,968 | A | | 5/1999 | McConnachie et al. |
| 6,569,544 | B1 | * | 5/2003 | Alain ................ H01L 51/5012 252/301.16 |
| 9,166,178 | B2 | * | 10/2015 | Schmid ................ H01L 51/506 |
| 10,256,422 | B2 | * | 4/2019 | Schmid .............. H01L 51/5088 |
| 10,305,047 | B2 | * | 5/2019 | Maltenberger ......... C09K 11/06 |
| 2003/0203168 | A1 | * | 10/2003 | Kagan ................ G11C 13/0014 428/200 |
| 2004/0023061 | A1 | | 2/2004 | Kathirgamanathan et al. |
| 2004/0119406 | A1 | | 6/2004 | Kobayashi |
| 2007/0042221 | A1 | | 2/2007 | Kawamura |
| 2009/0160319 | A1 | | 6/2009 | Song et al. |
| 2009/0212280 | A1 | * | 8/2009 | Werner ................ C09K 11/06 257/40 |
| 2010/0197536 | A1 | | 8/2010 | Mosier et al. |
| 2011/0037065 | A1 | * | 2/2011 | Ueno .................. H01L 51/009 257/40 |
| 2011/0163327 | A1 | * | 7/2011 | Ueno ................ H01L 51/5056 257/79 |
| 2012/0146010 | A1 | | 6/2012 | Ueno et al. |
| 2016/0115414 | A1 | * | 4/2016 | Mori ................ C10M 103/06 508/108 |

FOREIGN PATENT DOCUMENTS

| | | | | |
|---|---|---|---|---|
| CN | 102017216 | A | 4/2011 | |
| CN | 103456898 | A | 12/2013 | |
| EP | 2276086 | A1 | 1/2011 | |
| JP | H2288092 | A | 11/1990 | |
| JP | 2002508384 | A | 3/2002 | |
| JP | 2002343568 | A | 11/2002 | |
| JP | 4789359 | B2 | 10/2011 | |
| JP | 2008189564 | B2 * | 12/2012 | ........... C07C 327/00 |
| KR | 100548689 | B1 | 2/2006 | |
| KR | 20060014410 | A | 2/2006 | |
| KR | 20090013388 | A | 2/2009 | |
| KR | 20090068693 | A | 6/2009 | |
| KR | 20100019539 | A | 2/2010 | |
| KR | 20120052063 | A | 5/2012 | |
| KR | 20120112277 | A | 10/2012 | |
| KR | 20140054454 | A | 5/2014 | |
| KR | 101476776 | B1 | 12/2014 | |

OTHER PUBLICATIONS

Chinese Search Report for Application No. 201780042997.9 dated Jul. 1, 2020, 2 pages.

Search report from International Application No. PCT/KR2017/007087, dated Oct. 18, 2017.

Extended European Search Report including Written Opinion for Application No. EP17827856.0 dated Mar. 26, 2019.

* cited by examiner

| 701 |
|---|
| 601 |
| 501 |
| 401 |
| 301 |
| 201 |
| 101 |

ORGANIC ELECTROLUMINESCENT DEVICE AND MANUFACTURING METHOD THEREFOR

CROSS-REFERENCE TO RELATED APPLICATIONS

The present application is a national phase entry under 35 U.S.C. § 371 of International Application No. PCT/KR2017/007087 filed Jul. 4, 2017, which claims priority from Korean Patent Application No. 10-2016-0089386 filed Jul. 14, 2016, all of which are incorporated herein by reference.

TECHNICAL FIELD

The present specification relates to a method for manufacturing an organic electroluminescence device and an organic electroluminescence device manufactured using the same.

BACKGROUND ART

An organic light emission phenomenon is one of examples converting current to visible light by an internal process of specific organic molecules. A principle of an organic light emission phenomenon is as follows. When an organic material layer is placed between an anode and a cathode and a current is applied between the two electrodes, electrons and holes are injected to the organic material layer from the cathode and the anode, respectively. The holes and the electrons injected to the organic material layer recombine to form excitons, and light emits when these excitons fall back to the ground state. An organic electroluminescence device using such a principle may be generally formed with a cathode, an anode, and an organic material layer placed therebetween, for example, an organic material layer including a hole injection layer, a hole transfer layer, a light emitting layer and an electron transfer layer.

When manufacturing an organic electroluminescence device using a vacuum process, there are disadvantages in that a burden for high equipment investment costs and process costs is very high, uniformly enlarging the device has limits, and utilization of materials is low since, during deposition, the percentage of being wasted without being deposited on a substrate is high. Meanwhile, when manufacturing an organic electroluminescence device using a solution process, there are advantages in that manufacturing costs may be reduced by excluding high-priced deposition equipment, and a large area device is readily manufactured. However, when laminating layers forming an organic electroluminescence device through a solution process, lower layers are likely to be damaged by processes of forming upper layers, unlike in the deposition process. In other words, materials of lower layers are dissolved again by solvents or inks used in the solution process causing a phenomenon of mixing with upper layers or physically damaging a thin film. In order to prevent such a phenomenon, solvents used in each layer are employed not to have solubility for each other, or a process of preventing the dissolution of lower layers when forming upper layers through post-treatment for the lower layers may also be added.

In an organic electroluminescence device manufactured using such a solution process method, a hole injection layer material that is most often used is a conductive polymer. These do not have high solubility themselves, and normally have an aqueous solution form, and therefore, processibility is somewhat guaranteed since the solvent properties are different from organic solvents used in upper layers. In addition, when using these, a relatively low operating voltage is obtained. However, these normally use acidic dopant materials with a low pH and damage electrode materials that are lower layers, and thereby have a disadvantage of declining a life time property. Meanwhile, as another method of forming a hole injection layer, a method of forming by doping an ionic material or an n-type material such as TCNQ to an arylamine-based material is known. However, as described above, this method still has a problem of post process tolerance for solvents or inks.

DISCLOSURE

Technical Problem

The present specification is directed to providing a hole injection or transfer layer or charge generation layer coating composition that may be used when manufacturing an organic electroluminescence device using a solution process, a method for manufacturing an organic electroluminescence device using the same, and an organic electroluminescence device manufactured using the same.

Technical Solution

One embodiment of the present specification provides injection or transfer layer or charge generation layer coating composition of an organic electroluminescence device, the coating composition including an organic metal complex including sulfur; and an organic solvent.

According to another embodiment of the present specification, the coating composition further includes an organic metal complex that does not include sulfur. Herein, the organic metal complex that does not include sulfur is different from the organic metal complex including sulfur, and does not include sulfur.

Another embodiment of the present specification provides a method for manufacturing an organic electroluminescence device including preparing a substrate; forming a first electrode on the substrate; forming one or more organic material layers on the first electrode; and forming a second electrode on the organic material layer, and further including forming a hole injection or transfer layer or a charge generation layer between the first electrode and the organic material layer, between the second electrode and the organic material layer, or, when the organic material layer is present in two or more layers, between the organic material layers through a coating method using the coating composition according to the embodiment described above.

Another embodiment of the present specification provides an organic electroluminescence device including a first electrode; a second electrode; and one or more organic material layers provided between the first electrode and the second electrode, and further including a hole injection or transfer layer or a charge generation layer provided between the first electrode and the organic material layer, between the second electrode and the organic material layer, or, when the organic material layer is present in two or more layers, between the organic material layers, and including a metal oxy-sulfide.

Another embodiment of the present specification provides an organic electroluminescence device including a first electrode; a second electrode; and one or more organic material layers provided between the first electrode and the second electrode, and further including a hole injection or transfer layer or a charge generation layer provided between the first electrode and the organic material layer, between the second electrode and the organic material layer, or, when the organic material layer is present in two or more layers, between the organic material layers, and formed using the coating composition according to the embodiment described above.

Advantageous Effects

Metal oxides such as $MoO_3$, $WO_3$ and $V_2O_5$ mostly have a large band gap but do not have high conductivity. For example, $MoO_3$ has a band gap of 3.0 eV and, when used in a hole injection layer of an organic electroluminescence device, has an advantage of not absorbing light emitted from a light emitting layer. However, $MoO_3$ obtained using a vacuum deposition method does not have high conductivity and is known to function as an almost insulator. Meanwhile, Mo—S has a band gap of 1.8 eV and has increased potential to absorb light, but has high charge mobility. Accordingly, using this phenomenon, thin films of metal oxides such as Mo—O or metal sulfides such as Mo—S, and, in addition thereto, metal oxy-sulfides such as Mo (O, S), an intermediate state of these, are prepared, and by adjusting a ratio of O and S of these thin films, a band gap can be freely controlled, and charge mobility can be increased as well. Thin films prepared as above are useful as a hole injection or transfer layer or a charge generation layer of an organic electroluminescence device.

Particularly, by preparing such a thin film through a solution process method using a coating composition including an organic metal complex including sulfur and an organic solvent, an organic electroluminescence device with an increased device life time can be provided since there are no damages on electrodes such as an ITO electrode, interfacial properties are improved, and solvent resistance is excellent. Particularly, according to embodiments of the present specification, even when including substituents such as a halogen group is partially included, inks having proper viscosity and favorable coating properties can be prepared by using the organic metal complex described above since, by being dissolved in a ketone-based, an alcohol-based or an ester-based solvent, bonds are produced again by the solvent, which is useful in preparing a hole injection or transfer layer or a charge generation layer through a coating method. In addition, by using an organic solvent having partial polarity, a thin film-forming property is excellent compared to when using an aqueous solution dissolving metal oxide power itself by adding $H_2O_2$, $NH_4OH$ or the like thereto, a process of mass production such as ink jet can be used, and device properties can be enhanced since residual moisture is excluded.

DESCRIPTION OF DRAWINGS

The FIGURE is a diagram illustrating an example of an organic electroluminescence device according to one embodiment of the present specification.
101: Substrate
201: Anode
301: Hole Injection Layer
401: Hole Transfer Layer
501: Light Emitting Layer
601: Electron Transfer Layer
701: Cathode

MODE FOR DISCLOSURE

Hereinafter, the present specification will be described in detail.

In the present specification, a description of a certain member being placed "on" another member includes not only a case of the one member adjoining the another member but a case of still another member being present between the two members.

In the present specification, a description of a certain part "including" certain constituents means capable of further including other constituents, and does not exclude other constituents unless particularly stated on the contrary.

One embodiment of the present specification provides a hole injection or transfer layer or charge generation layer coating composition of an organic electroluminescence device, the coating composition including an organic metal complex; and an organic solvent.

According to another embodiment of the present specification, the organic metal complex including sulfur includes one, two or more of compounds represented by one of the following Chemical Formulae 1 to 4.

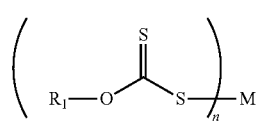

[Chemical Formula 1]

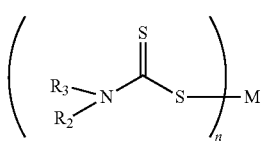

[Chemical Formula 2]

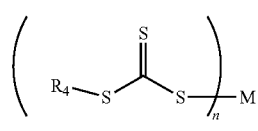

[Chemical Formula 3]

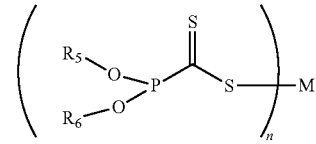

[Chemical Formula 4]

In Chemical Formulae 1 to 4,
M is a transition metal of group 5B, 6B or 7B, and preferably is Mo, V, W or Re,
n is an integer of 1 to 7,
$R_1$ to $R_6$ are the same as or different from each other, and each independently an alkyl group having 1 to 20 carbon atoms or an aryl group or hetero group having 6 to 20 carbon atoms.

According to another embodiment of the present specification, the coating composition further includes an organic metal complex that does not include sulfur. Herein, when using the organic metal complex that does not include sulfur, the organic metal complex including sulfur may be used in 0.01 mol % to 100 mol % in a molar ratio with respect to the organic metal complex that does not include sulfur.

In the embodiment, the organic metal complex that does not include sulfur may include W, Mo, V, Re, Ni, Mn, Fe, Ru, Os, Rh, Pd, Pt, Zr, Ti, Cu or the like as a metal, and may include one, two or more types of metals.

In the embodiment, the organic metal complex that does not include sulfur may be a complex having an oxidation number of −2 to +6. The organic metal complex includes an organic ligand bonding to the metal described above. The organic ligand is not particularly limited, but may be selected considering solvent solubility, an interfacial property with an adjacent organic material layer, or the like. Examples of the organic ligand may include carbonyl, an acetyl group, an acetylacetonate group, a methyl acetoacetate group, an ethyl acetoacetate group, thioacetate, isocyanate, cyanate, isocyanate, a halogen atom and the like. In addition, the organic ligand may have a structure including an aromatic ring and/or a heteroring, and examples thereof may include benzene, triphenylamine, fluorene, biphenyl, pyrene, anthracene, carbazole, phenylpyridine, trithiophene, phenyloxadiazole, phenyltriazole, benzimidazole, phenyltriazine, benzodithiazine, phenyl quinoxaline, phenylene vinylene, phenylsilole or combinations of these structures. The aromatic ring or the heteroring may have a substituent, and for example, the substituent may be an alkyl group, a halogen atom, an alkoxy group, a cyano group, a nitro group and the like. The alkyl group and the alkoxy group may have, for example, 1 to 12 carbon atoms.

Specifically, examples of the organic ligand may include alkoxy or acetate series such as acetylacetonate (acac), ethyl acetoacetate, methyl acetoacetate, OPh, carbonyl, methoxy, ethoxy, propoxy, isopropoxy, butoxy, sec-butoxy, tert-butoxy, pentoxy, hexyloxy, heptyloxy, octyloxy or ethylhexyloxy, but are not limited thereto. In addition, ligands having a form of these and a halogen group being present together may be included.

The organic metal complex may include a metal oxide, and the organic ligand described above may be coordinated to the metal oxide. Examples of the organic metal complex may include $W(CO)_6$, $Mo(CO)_6$, $WO_2Cl_2$, $MoO_2(acac)_2$, $Ni(acac)_2$, $Ti(OPh)_6$ or titanium(IV) oxide acetylacetonate. Another example may also include, when the organic metal complex includes V, $VO(acac)_2$ partially substituted with oxygen or $V(acac)_3$ not substituted with oxygen. Another example may also include, when the organic metal complex includes W, $W(acac)_3$, or $WO_2(acac)_2$ partially having an oxide form.

In addition, the organic metal complex may have a form in which two or more different ligands bond. For example, the organic metal complex may be titanium diisopropoxide bis(acetylacetate), titanium diisopropoxide bis(ethyl acetylacetate), molybdenum dichloride dioxide or $ReCl(CO)_5$.

According to another embodiment of the present specification, the organic metal complex including sulfur and the organic metal complex that does not include sulfur may include the same metal, or may include different metals.

In one embodiment, the organic solvent may be an alcohol-based or ether-based solvent.

In another embodiment, the organic solvent is a ketone-based solvent.

In the present specification, the organic solvent may be acetone, methylethylketone, diethylketone, cyclohexanone, cyclopentanone, isophorone, acetylacetone, tetralone, ethyl benzoate, methyl benzoate, ethyl acetate, ethyl acetoacetate, diethyl acetoacetate, methyl benzoate, ethyl benzoate, methanol, ethanol, propanol, isopropanol, butanol, sec-butanol, tert-butanol, pentanol, cyclopentanol, hexanol, cyclohexanol, heptanol, octanol, or a solvent represented by the following Chemical Formula 5.

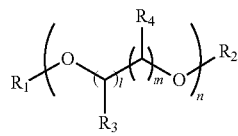

[Chemical Formula 5]

In Chemical Formula 5, n is an integer of 1 to 20, l and m are each or simultaneously an integer of 0 to 5, $R_1$, $R_2$, $R_3$ and $R_4$ are each or simultaneously a hydrogen atom, an alkyl group having 1 to 20 carbon atoms, an alkenyl group having 2 to 20 carbon atoms, an alkynyl group having 2 to 20 carbon atoms, an alkoxy group having 1 to 20 carbon atoms, an aryl group having 6 to 40 atoms, a heteroaryl group having 2 to 40 carbon atoms, or an ester group having 1 to 20 carbon atoms.

According to one embodiment, the organic solvent preferably has a boiling point of 350° C. or lower. Specific examples thereof may include ethylene glycol, ethylene glycol monomethyl ether, ethylene glycol monoethyl ether, ethylene glycol monopropyl ether, ethylene glycol monobutyl ether, ethylene glycol monopentyl ether, ethylene glycol monohexyl ether, ethylene glycol dimethyl ether, ethylene glycol diethyl ether, ethylene glycol dipropyl ether, ethylene glycol dibutyl ether, ethylene glycol dipentyl ether, ethylene glycol dihexyl ether, 1,2 propanediol, 1,3-propanediol, 1,4-butanediol, 1,2-butanediol, 1,3-butanediol, diethylene glycol, diethylene glycol monomethyl ether, diethylene glycol monoethyl ether, diethylene glycol monopropyl ether, diethylene glycol monobutyl ether, diethylene dimethyl ether, diethylene glycol diethyl ether, diethylene glycol dipropyl ether, diethylene glycol dibutyl ether, ethylene glycol diacetate, PEG 600, triethylene glycol or the like.

The solvent expressed by Chemical Formula 5 does not form chemically strong bonds with the organic metal complex used as a metal oxy-sulfide precursor, but prevents the precursor from readily changing into other oxidation states or materials, and therefore, has an advantage of producing an oxide thin film with no organic substances left after manufacturing a device.

According to one embodiment, the content of the organic metal complex including sulfur is preferably from 0.01% by weight to 50% by weight in the coating composition. According to another embodiment, the content of the organic metal complex including sulfur and the content of the organic metal complex that does not include sulfur are preferably from 0.01% by weight to 50% by weight in the coating composition. The coating composition may further include additives in addition to the organic metal complex in order to improve properties such as coating properties and viscosity. For example, the additive may include any one or more selected from the group consisting of a dispersant, a surfactant, a polymer, a binding agent, a crosslinking binding agent, an emulsifier, an antifoaming agent, a drying agent, a filler, an extender, a thickening agent, a film conditioning agent, an anti-oxidant, a free-flowing agent, a leveling additive and a corrosion inhibitor.

Another embodiment of the present specification relates to a method for manufacturing an organic electroluminescence device, and the method includes preparing a substrate; forming a first electrode on the substrate; forming one or more organic material layers on the first electrode; and forming a second electrode on the organic material layer, and further including forming a hole injection or transfer layer or a charge generation layer between the first electrode and the organic material layer, between the second electrode and the organic material layer, or, when the organic material layer is present in two or more layers, between the organic material layers through a coating method using the coating composition according to the embodiment described above.

The coating method forming a hole injection or transfer layer or a charge generation layer may be any one selected from the group consisting of, for example, a spin coating method, an inkjet method, nozzle printing, wet coating, spray coating, doctor blade coating, contact printing, upper feed reverse printing, lower feed reverse printing, nozzle feed reverse printing, gravure printing, microgravure printing, reverse mircogravure printing, roller coating, slot die coating, capillary coating, jet deposition and spray deposition, and may be preferably spin coating, inkjet coating, nozzle printing and the like.

The coating method may be carried out by coating the composition described above on the first electrode or the second electrode, and then drying the result. Drying and heat treatment or heat treatment after drying may be carried out under nitrogen or in the atmosphere, however, carrying out in the atmosphere is advantageous in removing the solvent and the organic ligand, and is advantageous in converting the organic metal complex to a metal oxy-sulfide. In addition, as for the heat treatment, the treatment temperature may vary depending on the organic metal complex used, but may be 150° C. or higher, preferably 180° C. or higher and more preferably 200° C. or higher.

According to one embodiment, the hole injection or transfer layer or the charge generation layer formed using the coating composition has a thickness of 1 nm to 1,000 nm. In a general organic electroluminescence device, the whole device thickness needs to be optimized due to a cavity effect, and when optimizing the thickness, the thickness needs to be changed from a few nm to 1 micrometer depending on the upper layer materials. Herein, when capable of varying the charge injection or transfer layer thickness without declining device properties, limits in the upper layer device structure and thickness changes decrease, which is advantageous in providing optimized device properties. The hole injection or transfer layer provided in the present disclosure provides a material and a device with no voltage increases by the thickness.

According to another embodiment, the manufacturing method further includes annealing after forming the hole injection or transfer layer or the charge generation layer using the coating composition. The annealing may be carried out at a temperature of 150° C. to 250° C. and preferably 180° C. to 250° C. In the present disclosure, the annealing aims to remove the organic ligand of the organic metal complex in the annealing process and change to a metal oxy-sulfide, and therefore, the temperature is preferably a high temperature enough to decompose the ligand of the organic metal complex and the atmosphere is preferably an atmosphere having oxygen in order to change to an oxy-sulfide.

In the embodiment, except that the hole injection or transfer layer or the charge generation layer is formed using the coating composition according to the embodiment described above, materials and preparation methods of other electrodes and organic material layers may use those known in the art.

According to one embodiment, the first electrode is an anode and the second electrode is a cathode.

According to another embodiment, the second electrode is an anode, and the first electrode is a cathode.

According to one embodiment, the organic material layer includes a light emitting layer.

According to another embodiment, the organic material layer may be formed in a multilayer structure, and for example, may include a light emitting layer and at least one layer of a hole injection layer, a hole transfer layer, an electron transfer layer, an electron injection layer, an electron blocking layer and a hole blocking layer. For example, a structure of an organic electroluminescence device according to one embodiment of the present specification is illustrated in the FIGURE.

The FIGURE illustrates a structure of an organic electroluminescence device in which an anode (201), a hole injection layer (301), a hole transfer layer (401), a light emitting layer (501), an electron transfer layer (601) and a cathode (701) are consecutively laminated on a substrate (101). In the FIGURE, the hole injection layer (301) may be formed using the coating composition described above. However, the FIGURE illustrates an organic electroluminescence device, and the organic electroluminescence device is not limited thereto.

When the organic electroluminescence device includes a plurality of organic material layers, the organic material layers may be formed with materials the same as or different from each other.

For example, the organic electroluminescence device of the present specification may be manufactured by consecutively laminating an anode, an organic material layer and a cathode on a substrate. Herein, the organic electroluminescence device may be manufactured by forming an anode on a substrate by depositing a metal, a metal oxide having conductivity, or an alloy thereof using a physical vapor deposition (PVD) method such as sputtering or e-beam evaporation, forming an organic material layer including a hole injection layer, a hole transfer layer, a light emitting layer and an electron transfer layer thereon, and then depositing a material capable of being used as a cathode thereon. In addition to such a method, the organic electroluminescence device may also be manufactured by consecutively depositing a cathode material, an organic material layer and an anode material on a substrate. Herein, at least one layer or all the layers present between the anode and the cathode may be formed using a solution process. Examples of the solution process may include a printing method such as inkjet printing, nozzle printing, offset printing, transfer printing or screen printing, but are not limited thereto. Using the solution process is economically effective in terms of time and costs when manufacturing the device. When the organic material layer is formed using the solution process, heat treatment or light treatment may be further carried out as necessary. Herein, the heat treatment temperature and time may be selected depending on the process condition or the materials used, and for example, the heat treatment may be carried out for 1 minute to 1 hour at 85° C. to 300° C.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO), indium gallium zinc oxide (IGZO), fluorine-doped tin oxide (FTC) and indium zinc oxide (IZO); combinations of metals and oxides such as ZnO:Al or $SnO_2$:Sb; conductive polymers such as poly(3-methylthiophene), poly[3,4-(ethylene-1,2-dioxy) thiophene] (PEDOT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

When forming an additional hole injection layer in addition to the hole injection or transfer layer formed using the coating composition including the organic metal complex described above, the hole injection layer material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suitable. Specific examples thereof include arylamine-based organic materials, conductive polymers, block copolymers having conjugated parts and non-conjugated parts together, and the like, but are not limited thereto.

The light emitting layer material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxyquinoline aluminum complexes ($Alq_3$); carbazole-based compounds; dimerized styryl compounds; BAlq; 10-hydroxybenzoquinoline-metal compounds; benzoxazole- benzothiazole- and benzimidazole-based compounds; poly(p-phenylenevinylene) (PPV)-based polymers; spiro compounds; polyfluorene, rubrene, and the like, but are not limited thereto.

The light emitting layer may include a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes carbazole derivatives, dibenzofuran derivatives, ladder-type furan compounds, pyrimidine derivatives and the like, but the material is not limited thereto.

The dopant material includes aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and includes arylamino group-including pyrene, anthracene, chrysene, peryflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, but the styrylamine compound is not limited thereto. In addition, the metal complex includes iridium complexes, platinum complexes or the like, but is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suitable. Specific examples thereof include Al complexes of 8-hydroxyquinoline; complexes including $Alq_3$; organic radical compounds; hydroxyflavon-metal complexes, and the like, but are not limited thereto. The electron transfer layer may be used together with any desired cathode material as used in the art. Particularly, examples of the suitable cathode material include common materials that have small work function, and in which an aluminum layer or a silver layer follows. Specifically, the cathode material includes cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition thereto, has an excellent thin film forming ability. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)berylium, bis (10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and generally, may be formed under the same condition as the hole injection layer. Specifically, oxadiazole derivatives or triazole derivatives, phenanthroline derivatives, BCP, aluminum complexes and the like are included, but the material is not limited thereto.

Another embodiment of the present specification provides an organic electroluminescence device including a first electrode; a second electrode; and one or more organic material layers provided between the first electrode and the second electrode, and further including a hole injection or transfer layer or a charge generation layer provided between the first electrode and the organic material layer, between the second electrode and the organic material layer, or, when the organic material layer is present in two or more layers, between the organic material layers, and including a metal oxy-sulfide.

Another embodiment of the present specification provides an organic electroluminescence device including a first electrode; a second electrode; and one or more organic material layers provided between the first electrode and the second electrode, and further including a hole injection or transfer layer or a charge generation layer provided between the first electrode and the organic material layer, between the second electrode and the organic material layer, or, when the organic material layer is present in two or more layers, between the organic material layers, and formed using the coating composition according to the embodiments described above.

The hole injection or transfer layer or the charge generation layer formed using the coating composition includes a metal oxy-sulfide.

According to one embodiment, the S/O ratio in the hole injection or transfer layer or the charge generation layer is from 0.1 to 100. In other words, when expressing the ratio of each element in the hole injection or transfer layer or the charge generation layer as $M(O_xS_y)_z$, $0<Z\leq4$, and $0\leq x<1$ and $0<y\leq1$ when $x+y=1$.

According to another embodiment, the hole injection or transfer layer or the charge generation layer has a band gap of 1.8 eV to 3.5 eV.

According to one embodiment, the hole injection or transfer layer or the charge generation layer formed using the coating composition has a thickness of 1 nm to 1,000 nm. Herein, in the hole injection or transfer layer or the charge generation layer, charge concentration and mobility increase due to the metal sulfide, and a voltage decrease caused by the thickness does not occur.

According to another embodiment, the hole injection or transfer layer or the charge generation layer formed using the coating composition is annealed. For example, the hole injection or transfer layer or the charge generation layer is annealed at a temperature of 150° C. to 250° C. and preferably 180° C. to 250° C.

As for other constitutions of the organic electroluminescence device, the descriptions provided above and constitutions known in the art may be applied.

The organic electroluminescence device according to the present specification may be a top-emission type, a bottom-emission type or a dual-emission type depending on the materials used.

Hereinafter, the present specification will be described in detail with reference to examples in order to specifically describe the present specification. However, the examples according to the present specification may be modified to various different forms, and the scope of the present specification is not to be construed as being limited to the examples described below. Examples of the present specification are provided in order to more fully describe the present specification to those having average knowledge in the art.

EXAMPLE 1

After washing an ITO-coated glass substrate consecutively with water and isopropanol, a solution dissolving 50:50 (weight ratio) of $MoO_2(acac)_2$ and Mo-ethylxantate in ethylene glycol monomethyl ether in 4 wt % was spin coated on the ITO-deposited base for 30 seconds at 2000 rpm. The obtained thin film was heat treated for 15 minutes at 200° C. under oxygen atmosphere to form a very uniform hole injection layer having a thickness of 10 nm.

On the top of the hole injection layer, a hole transfer layer having a thickness of 650 Å was formed using 4,4'-bis[N-(1-naphthyl)-N-phenylamino]biphenyl (NPB).

On the top of the hole transfer layer, an electron blocking layer was formed to a thickness of 150 Å. On the electron blocking layer, a light emitting layer having a thickness of 300 Å was formed by doping BD, a blue dopant, to BH, a blue fluorescent host of the following chemical formula, in a weight ratio of 95:5.

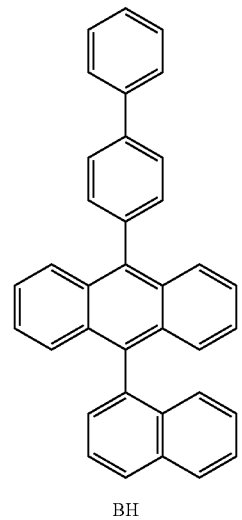

BH

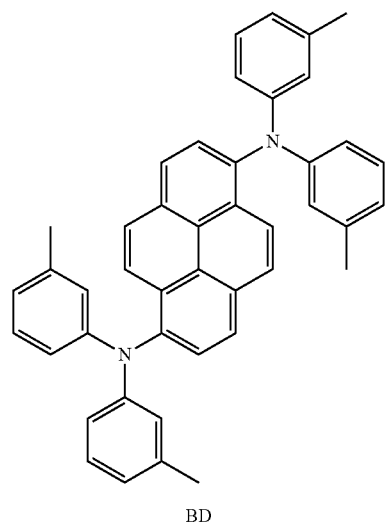

BD

-continued

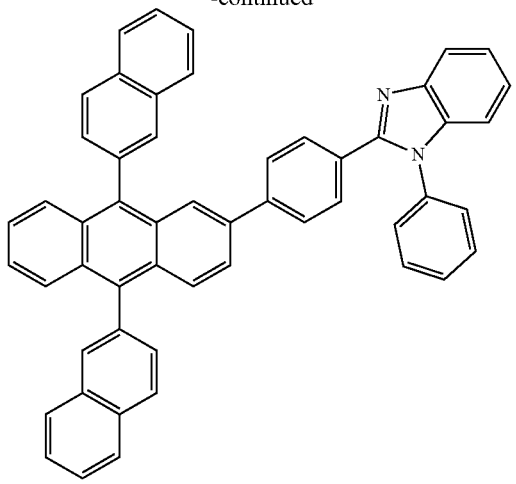

ET 201

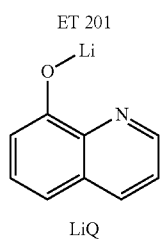

LiQ

Subsequently, on the top of the light emitting layer, an electron transfer layer having a thickness of 200 Å was formed by simultaneously depositing ET 201 and LIQ, electron transfer materials, in a weight ratio of 1:1.

Finally, Al was deposited on the electron transfer layer to a thickness of 800 Å to manufacture an organic electroluminescence device. Properties of this device are shown in Table 1.

EXAMPLE 2

A device was manufactured in the same manner as in Example 1 except that Mo-diethylthiocarbamate was used instead of Mo-ethylxantate.

EXAMPLE 3

A device was manufactured in the same manner as in Example 1 except that VO(acac)$_2$ was used instead of MoO$_2$(acac)$_2$, and V-ethylxantate was used instead of Mo-ethylxantate.

EXAMPLE 4

A device was manufactured in the same manner as in Example 1 except that WO$_2$(acac)$_2$ was used instead of MoO$_2$(acac)$_2$, and W-ethylxantate was used instead of Mo-ethylxantate.

COMPARATIVE EXAMPLE 1

A device was manufactured in the same manner as in Example 1 except that the hole transfer layer was formed by depositing NPB on the ITO without the hole injection layer.

Voltage, efficiency and life time (LT80) properties of the devices manufactured in the examples and the comparative example described above were measured under a condition of 10 m/cm$^2$, and the measurement results are shown in the following Table 1.

TABLE 1

| | Organic Metal Complex 1 | Organic Metal Complex 2 | Voltage | Efficiency (EQE) | LT80 |
|---|---|---|---|---|---|
| Example 1 | MoO2(acac)2 | Mo-ethylxantate | 4.53 | 5.06 | 30 |
| Example 2 | MoO2(acac)2 | Mo-diethylthiocarbamate | 4.3 | 4.21 | 28 |
| Example 3 | VO(acac)2 | V-ethylxantate | 4.69 | 4.91 | 15 |
| Example 4 | WO2(acac)2 | W-ethylxantate3 | 5.83 | 4.69 | 20 |
| Comparative Example 1 | w/o HIL | — | >20 V | X | X |

As shown in the table, device efficiency and life time property were enhanced compared to when a hole injection layer was formed by depositing a metal oxide mostly, or a hole injection layer was not formed.

The invention claimed is:

1. A hole injection or transfer layer or charge generation layer coating composition of an organic electroluminescent device, the coating composition comprising:
an organic metal complex including sulfur; and
an organic solvent,
wherein the organic metal complex including sulfur includes one, or more of compounds represented by the following Chemical Formulae 1 to 4:

[Chemical Formula 1]

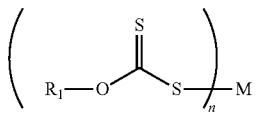

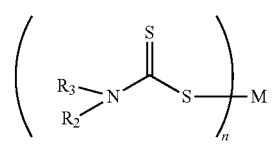

[Chemical Formula 2]

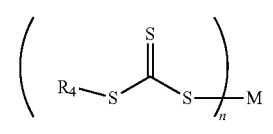

[Chemical Formula 3]

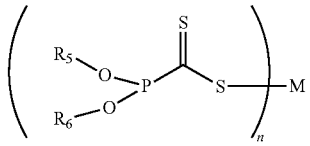

[Chemical Formula 4]

in Chemical Formulae 1 to 4,

M is a transition metal of group 5B, 6B or 7B, n is an integer of 1 to 7, and $R_1$ to $R_6$ are the same as or different from each other, and are each independently or simultaneously an alkyl group having 1 to 20 carbon atoms or an aryl group or heteroaryl group having 6 to 20 carbon atoms, and wherein the organic solvent is an alcohol-based solvent, an ether-based solvent or a ketone-based solvent.

2. The hole injection or transfer layer or charge generation layer coating composition of an organic electroluminescent device of claim 1, wherein M is Mo, V, W or Re.

3. The hole injection or transfer layer or charge generation layer coating composition of an organic electroluminescent device of claim 1, the coating composition further comprising an organic metal complex that does not include sulfur.

4. The hole injection or transfer layer or charge generation layer coating composition of an organic electroluminescent device of claim 3, wherein the organic metal complex that does not include sulfur includes a metal selected from the group consisting of W, Mo, V, Re, Ni, Mn, Fe, Ru, Os, Rh, Pd, Pt, Zr, Ti, Cu, and combinations thereof, and an organic ligand bonding to the metal.

5. The hole injection or transfer layer or charge generation layer coating composition of an organic electroluminescent device of claim 4, wherein the organic metal complex that does not include sulfur includes Mo, V, W or Re.

6. The hole injection or transfer layer or charge generation layer coating composition of an organic electroluminescent device of claim 1, wherein the organic solvent is an alcohol-based solvent or a ketone-based solvent.

7. The hole injection or transfer layer or charge generation layer coating composition of an organic electroluminescent device of claim 1, wherein the organic solvent includes a solvent represented by the following Chemical Formula 5:

[Chemical Formula 5]

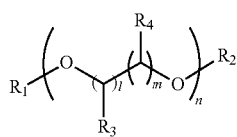

in Chemical Formula 5, n is an integer of 1 to 20, 1 and m are each or simultaneously an integer of 0 to 5, $R_1$, $R_2$, $R_3$ and $R_4$ are each or simultaneously a hydrogen atom, an alkyl group having 1 to 20 carbon atoms, an alkenyl group having 2 to 20 carbon atoms, an alkynyl group having 2 to 20 carbon atoms, an alkoxy group having 1 to 20 carbon atoms, an aryl group having 6 to 40 carbon atoms, a heteroaryl group having 2 to 40 carbon atoms, or an ester group having 1 to 20 carbon atoms.

8. The hole injection or transfer layer or charge generation layer coating composition of an organic electroluminescent device of claim 1, wherein the organic solvent includes at least one of ethylene glycol, ethylene glycol monomethyl ether, ethylene glycol monoethyl ether, ethylene glycol monopropyl ether, ethylene glycol monobutyl ether, ethylene glycol monopentyl ether, ethylene glycol monohexyl ether, ethylene glycol dimethyl ether, ethylene glycol diethyl ether, ethylene glycol dipropyl ether, ethylene glycol dibutyl ether, ethylene glycol dipentyl ether, ethylene glycol dihexyl ether, 1,2 propanediol, 1,3-propanediol, 1,4-butanediol, 1,2-butanediol, 1,3-butanediol, diethylene glycol, diethylene glycol monomethyl ether, diethylene glycol monoethyl ether, diethylene glycol monopropyl ether, diethylene glycol monobutyl ether, diethylene dimethyl ether, diethylene glycol diethyl ether, diethylene glycol dipropyl ether, diethylene glycol dibutyl ether, ethylene glycol diacetate, PEG 600, or triethylene glycol.

9. An organic electroluminescent device comprising:

a first electrode;

a second electrode; and one or more organic material layers provided between the first electrode and the second electrode, and further comprising a hole injection or transfer layer or a charge generation layer provided between the first electrode and the organic material layer, between the second electrode and the organic material layer, or, when the organic material layer is present in two or more layers, between the organic material layers, and formed from the coating composition of claim 1.

10. The organic electroluminescent device of claim 9, wherein the hole injection or transfer layer or the charge generation layer has a thickness of 1 nm to 1,000 nm.

11. The organic electroluminescent device of claim 9, wherein the hole injection or transfer layer or the charge generation layer is annealed.

12. The organic electroluminescent device of claim 9, wherein the hole injection or transfer layer or the charge generation layer is annealed at a temperature of 150° C. to 250° C.

13. The organic electroluminescent device of claim 9, wherein, when expressing a ratio of each element in the hole injection or transfer layer or the charge generation layer as $M(O_xS_y)_z$, $0<Z\leq4$, and $0\leq x<1$ and $0<y\leq1$ when $x+y=1$.

14. The organic electroluminescent device of claim 9, wherein the hole injection or transfer layer or the charge generation layer has a band gap of 1.8 eV to 3.5 eV.

15. A method for manufacturing an organic electroluminescent device comprising:

preparing a substrate;

forming a first electrode on the substrate;

forming one or more organic material layers on the first electrode; and forming a second electrode on the organic material layer, and further comprising forming a hole injection or transfer layer or a charge generation layer between the first electrode and the organic material layer, between the second electrode and the organic material layer, or, when the organic material layer is present in two or more layers, between the organic material layers, from the coating composition of claim 1.

16. The method for manufacturing an organic electroluminescent device of claim 15, wherein the hole injection or transfer layer or the charge generation layer formed from the coating composition has a thickness of 1 nm to 1,000 nm.

17. The method for manufacturing an organic electroluminescent device of claim 15, further comprising annealing after the forming of the hole injection or transfer layer or a charge generation layer from the coating composition.

18. The method for manufacturing an organic electroluminescent device of claim 17, wherein the annealing is carried out at a temperature of 150° C. to 250° C.

19. An organic electroluminescent device comprising:
a first electrode;
a second electrode; and
one or more organic material layers provided between the first electrode and the second electrode,
and further comprising a hole injection or transfer layer or a charge generation layer provided between the first electrode and the organic material layer, between the second electrode and the organic material layer, or, when the organic material layer is present in two or more layers, between the organic material layers, and including a metal oxy-sulfide,
wherein the metal oxy-sulfide is formed from an organic metal complex comprising one, or more of compounds represented by one of the following Chemical Formulae 1 to 4:

[Chemical Formula 1]

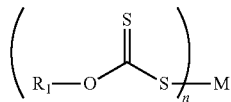

[Chemical Formula 2]

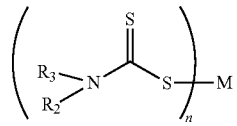

[Chemical Formula 3]

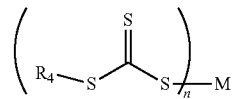

[Chemical Formula 4]

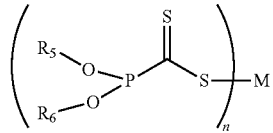

in Chemical Formulae 1 to 4,

M is a transition metal of group 5B, 6B or 7B, n is an integer of 1 to 7, and $R_1$ to $R_6$ are the same as or different from each other, and are each independently or simultaneously an alkyl group having 1 to 20 carbon atoms or an aryl group or heteroaryl group having 6 to 20 carbon atoms.

* * * * *